United States Patent
Ando et al.

(10) Patent No.: US 10,559,676 B2
(45) Date of Patent: Feb. 11, 2020

(54) VERTICAL FET WITH DIFFERENTIAL TOP SPACER

(71) Applicant: International Business Machines Corporation, Armonk, NY (US)

(72) Inventors: Takashi Ando, Tuckahoe, NY (US); Choonghyun Lee, Rensselaer, NY (US); Jingyun Zhang, Albany, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 15/960,078

(22) Filed: Apr. 23, 2018

(65) Prior Publication Data

US 2019/0326410 A1    Oct. 24, 2019

(51) Int. Cl.
*H01L 29/66* (2006.01)
*H01L 27/092* (2006.01)
*H01L 29/78* (2006.01)
*H01L 21/8238* (2006.01)
(Continued)

(52) U.S. Cl.
CPC .. *H01L 29/6681* (2013.01); *H01L 21/823437* (2013.01); *H01L 21/823462* (2013.01); *H01L 21/823821* (2013.01); *H01L 27/0924* (2013.01); *H01L 29/4966* (2013.01); *H01L 29/66666* (2013.01); *H01L 29/7827* (2013.01)

(58) Field of Classification Search
CPC .................................................. H01L 29/6681
See application file for complete search history.

(56) References Cited

U.S. PATENT DOCUMENTS 9,679,984 B2   6/2017  Chung et al.
9,773,708 B1   9/2017  Zhang et al.
9,780,208 B1   10/2017  Xie et al.
(Continued)

OTHER PUBLICATIONS

Kim et al., "Novel Single Metal Gate CMOS Integration with Effective Workfunction Modulation by a Differential Spacer: Manipulation of Oxygen Vacancy," 2009 International Conference on Solid State Devices and Materials, (Oct. 2009) (2 total pages).
(Continued)

*Primary Examiner* — Xia L Cross
(74) *Attorney, Agent, or Firm* — Vazken Alexanian; Michael J. Chang, LLC

(57) ABSTRACT

VTFET devices having a differential top spacer are provided. In one aspect, a method of forming a VTFET device includes: patterning fins in a wafer including NFET and PFET fins; forming bottom source and drains at a base of the NFET/PFET fins; forming bottom spacers on the bottom source and drains; forming gate stacks alongside the NFET/PFET fins that include a same workfunction metal on top of a gate dielectric; annealing the gate stacks which generates oxygen vacancies in the gate dielectric; forming top spacers that include an oxide spacer layer in contact with only the gate stacks alongside the PFET fins, wherein the oxide spacer layer supplies oxygen filling the oxygen vacancies in the gate dielectric only in the gate stacks alongside the PFET fins; and forming top source and drains above the gate stacks at the tops of the NFET/PFET fins. A VTFET device is also provided.

14 Claims, 7 Drawing Sheets

NFET

PFET (51) Int. Cl.
*H01L 21/8234* (2006.01)
*H01L 29/49* (2006.01)

(56) References Cited

U.S. PATENT DOCUMENTS

| | | |
|---|---|---|
| 9,786,768 B1 | 10/2017 | Balakrishnan et al. |
| 9,859,421 B1 | 1/2018 | Robinson et al. |
| 2012/0043620 A1* | 2/2012 | Guo ............... H01L 21/845 257/391 |
| 2016/0005831 A1* | 1/2016 | Ando .............. H01L 29/4966 257/401 |
| 2017/0025315 A1 | 1/2017 | Ando et al. |

OTHER PUBLICATIONS

Ando et al., "Simple Gate Metal Anneal (SIGMA) Stack for FinFET Replacement Metal Gate Toward 14nm and beyond," 2014 Symposium on VLSI Technology Digest of Technical Papers Jun. 2014 (2 total pages).

* cited by examiner

NFET

FIG. 1A

PFET

FIG. 1B

NFET

FIG. 2A

PFET

VERTICAL FET WITH DIFFERENTIAL TOP SPACER

FIELD OF THE INVENTION

The present invention relates to vertical transport field effect transistors (VTFETs), and more particularly, to VTFETs having a differential top spacer.

BACKGROUND OF THE INVENTION

As opposed to planar complementary metal-oxide-semiconductor (CMOS) devices, vertical transport field effect transistors (VTFETs) are oriented with a vertical fin channel disposed on bottom source and drains and a top source and drain disposed on the vertical fin channel. A gate runs vertically alongside the vertical fin channel.

A replacement metal gate process for FETs is beneficial as it permits gate metal workfunction customization and tuning. However, there are notable challenges associated with a replacement metal gate process and the VTFET design. Namely, the device is built from the bottom up, with the top source and drains being grown in top of the channel after the gate has been formed. The elevated temperatures (e.g., exceeding 600° C.) associated with the top source and drain formation can degrade a conventional replacement metal gate. For instance, at temperatures greater than or equal to about 600° C., conventional n-channel VTFET designs undesirably experience a dramatic increase in leakage current while p-channel VTFET designs undesirably experience a threshold voltage (Vt) increase.

Therefore, thermally stable replacement metal gate stack designs for a VTFET architecture would be desirable.

SUMMARY OF THE INVENTION

The present invention provides vertical transport field effect transistor (VTFET) devices having a differential top spacer. In one aspect of the invention, a method of forming a VTFET device is provided. The method includes: patterning fins in a wafer, the fins including n-channel FET (NFET) fins and p-channel FET (PFET) fins; forming bottom source and drains at a base of the NFET fins and the PFET fins; forming bottom spacers on the bottom source and drains; forming gate stacks alongside the NFET fins and the PFET fins, wherein the gate stacks formed alongside the NFET fins and the PFET fins include a same workfunction metal on top of a gate dielectric; annealing the gate stacks which generates oxygen vacancies in the gate dielectric; depositing a gate fill metal over the NFET fins, the PFET fins and the gate stacks; forming top spacers over the gate stacks at tops of the NFET fins and the PFET fins, wherein the top spacers include an oxide spacer layer in contact with only the gate stacks alongside the PFET fins, wherein the oxide spacer layer supplies oxygen filling the oxygen vacancies in the gate dielectric only in the gate stacks alongside the PFET fins; and forming top source and drains above the gate stacks at the tops of the NFET fins and the PFET fins.

In another aspect of the invention, a VTFET device is provided. The VTFET device includes: fins patterned in a wafer, the fins including NFET fins and PFET fins; bottom source and drains at a base of the NFET fins and the PFET fins; bottom spacers disposed on the bottom source and drains; gate stacks alongside the NFET fins and the PFET fins, wherein the gate stacks alongside the NFET fins and the PFET fins include a same workfunction metal disposed on top of a gate dielectric; a gate fill metal disposed over the NFET fins, the PFET fins and the gate stacks; top spacers disposed over the gate stacks at tops of the NFET fins and the PFET fins, wherein the top spacers include an oxide spacer layer in contact with only the gate stacks alongside the PFET fins; and top source and drains above the gate stacks at the tops of the NFET fins and the PFET fins.

A more complete understanding of the present invention, as well as further features and advantages of the present invention, will be obtained by reference to the following detailed description and drawings.

DETAILED DESCRIPTION OF PREFERRED EMBODIMENTS

As provided above, a significant challenge to successfully implementing a replacement metal gate process for vertical transport field-effect transistor (VTFET) designs is the large thermal budget associated with the top source and drain growth post formation of the replacement metal gate. Namely, significant degradation of the replacement metal gate occurs at the elevated temperatures employed during formation of the top source and drains, which can exceed 600 degrees Celsius (° C.).

Advantageously, provided herein are thermally stable VTFET designs and process for formation thereof. The present techniques apply several novel aspects to VTFET fabrication. First, thermal stability can be achieved when workfunction-setting gate metals such as titanium nitride (TiN) and tantalum nitride (TaN) above a critical physical thickness ($T_{CRIT}$) are placed on top of high-κ gate dielectrics such as hafnium (Hf)- or zirconium (Zr)-based high-κ gate dielectrics even when subjected to temperatures exceeding 900° C. According to an exemplary embodiment, $T_{CRIT}$ is about 3.0 nanometers (nm). The term "high-κ" as used herein refers to a material having a relative dielectric constant κ which is much higher than that of silicon dioxide (e.g., a dielectric constant κ=20 for hafnium oxide ($HfO_2$) rather than 4 for silicon dioxide ($SiO_2$)).

Second, the workfunction can be set using different top spacer configurations for n-channel VTFET (NFET) and p-channel VTFET (PFET) devices. This notion advantageously permits the same workfunction metal (e.g., TiN or TaN) to be employed in both NFET and PFET devices, simplifying the present fabrication process (i.e., by concurrently depositing the same workfunction metal for both NFETs and PFETs) as compared to conventional process flows requiring the selective placement of different workfunction metals in NFET versus PFET devices.

Leveraging these unique aspects, an exemplary methodology for forming a VTFET device is now described. The process begins with the patterning of a plurality of fins in a wafer. To do so, standard lithography and etching techniques are used to pattern a plurality of fin hardmasks 102 on a wafer 104. See FIG. 1A (NFET) and FIG. 1B (PFET). The fin hardmasks mark the footprint and location of a plurality of (NFET and PFET) fins to be patterned in the wafer. See below. Suitable materials for the fin hardmasks 102 include, but are not limited to, silicon nitride (SiN).

Figure 1A:
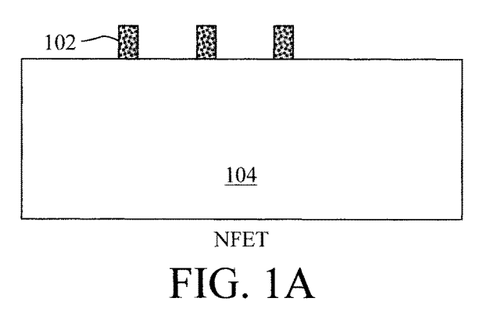
FIG. 1A is a cross-sectional diagram illustrating a plurality of fin hardmasks having been formed on a wafer marking the footprint and location of a plurality of n-channel field effect transistor (NFET) fins according to an embodiment of the present invention.
Figure 1B:
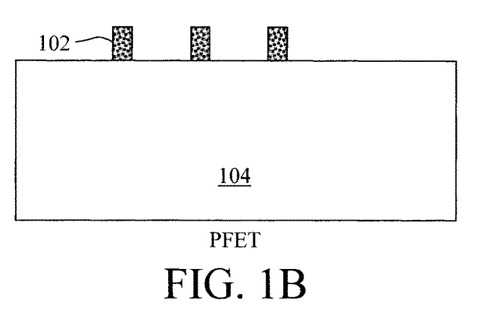
FIG. 1B is a cross-sectional diagram illustrating a plurality of fin hardmasks having been formed on a wafer marking the footprint and location of a plurality of p-channel field effect transistor (PFET) fins according to an embodiment of the present invention.

The steps involved in forming NFET and PFET devices on a common wafer will be described by way of reference to figures designated as A and B, respectively. For instance, what is shown in FIG. 1A applies to the NFET devices and what is shown in FIG. 1B applies to the PFET devices. The NFET and PFET process flows are illustrated in separate figures (e.g., FIG. 1A and FIG. 1B, respectively) merely for ease and clarity of depiction. However, it is to be understood that these processes can be performed on the same (common) wafer if so desired, with one or more of the steps being performed in both the NFET and PFET devices concurrently—as indicated below.

A variety of different wafer 104 configurations can be implemented in accordance with the present techniques. For instance, according to one exemplary embodiment, the starting wafer 104 is a bulk semiconductor wafer, such as a bulk silicon (Si), bulk germanium (Ge), bulk silicon germanium (SiGe) and/or bulk III-V semiconductor wafer. Alternatively, wafer 104 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

Figure 2A:
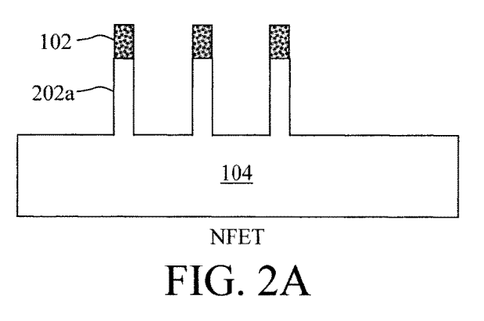
FIG. 2A is a cross-sectional diagram illustrating the fin hardmasks having been used to pattern NFET fins in the wafer according to an embodiment of the present invention.
Figure 2B:
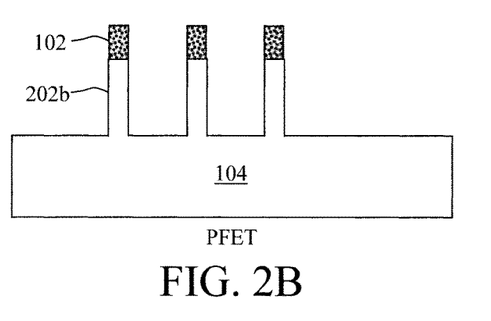
FIG. 2B is a cross-sectional diagram illustrating the fin hardmasks having been used to pattern PFET fins in the wafer according to an embodiment of the present invention.

The fin patterning can be performed concurrently for both NFET and PFET devices on the wafer 104. Namely, as shown in FIG. 2A and FIG. 2B, respectively, the fin hardmasks 102 are used to etch (NFET) fins 202a and (PFET) fins 202b concurrently in the wafer 104. A directional (anisotropic) etching process such as reactive ion etching (RIE) can be used for the fin etch.

Bottom source and drains 302 (NFET) and bottom source and drains 304 (PFET) are then formed in the wafer 104 at the base of the fins 202a and 202b, respectively. See FIG. 3A and FIG. 3B, respectively. According to an exemplary embodiment, the bottom source and drains 302 and 304 are formed using an ion implantation process whereby an n-type dopant(s) (for NFET devices) or p-type dopant(s) (for PFET devices) is/are implanted into the wafer 104 at the base of the fins 202a and 202b, respectively. Suitable n-type dopants include, but are not limited to, phosphorous (P) and/or arsenic (As), and suitable p-type dopants include, but are not limited to, boron (B). Alternatively, the bottom source and drains 302 and 304 are formed by growing an in-situ (during epitaxial growth) or ex-situ (via ion implantation) doped epitaxial material at the base of the fins 202a and 202b. By way of example only, phosphorus-doped Si (Si:P) may be grown for the NFET devices and boron-doped SiGe (SiGe: B) may be grown for the PFET devices.

Figure 3A:
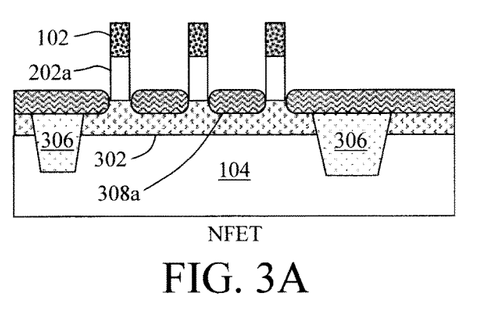
FIG. 3A is a cross-sectional diagram illustrating NFET bottom source and drains having been formed in the wafer at the base of the NFET fins, shallow trench isolation (STI) regions having been formed in the wafer to isolate the NFET bottom source and drains, and bottom spacers having been formed on the NFET bottom source and drains according to an embodiment of the present invention.
Figure 3B:
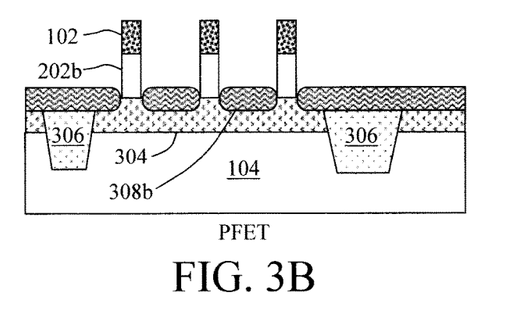
FIG. 3B is a cross-sectional diagram illustrating PFET bottom source and drains having been formed in the wafer at the base of the PFET fins, STI regions having been formed in the wafer to isolate the PFET bottom source and drains, and bottom spacers having been formed on the PFET bottom source and drains according to an embodiment of the present invention.

Shallow trench isolation (STI) regions 306 are then formed in the wafer 104 to isolate the bottom source and drains 302 and 304 of the NFET and PFET devices, respectively. See FIG. 3A and FIG. 3B. The formation of STI regions 306 can be performed concurrently for the NFET and PFET devices. STI involves first patterning (STI) trenches in the wafer 104, and then filling the trenches with an insulator such as an oxide (also referred to herein as an "STI oxide"). As shown in FIG. 3A and FIG. 3B, the STI regions 306 extend through the bottom source and drains 302 and 304 and into the wafer 104.

Bottom spacers 308a and 308b are next formed on the bottom source and drains 302 and 304, respectively. The formation of the bottom spacers 308a and 308b can be performed concurrently for the NFET and PFET devices. Suitable materials for bottom spacers 308a and 308b include, but are not limited to, oxide spacer materials such as $SiO_2$ and/or silicon oxycarbide (SiOC) and/or nitride spacer materials such as silicon nitride (SiN) and/or silicon-boron-nitride (SiBN).

According to an exemplary embodiment, the bottom spacers 308a and 308b are formed using a directional deposition process whereby the spacer material is deposited onto the bottom source and drains 302/304, fin hardmasks 102, and fins 202a/202b with a greater amount of the material being deposited on horizontal surfaces (including on top of the bottom source and drains 302/304 in between the fins 202a/202b, respectively), as compared to vertical surfaces (such as along sidewalls of the fins 202a/202b). Thus, when an etch is used on the spacer material, the timing of the etch needed to remove the spacer material from the vertical surfaces will leave the bottom spacers 308a and 308b shown in FIG. 3A and FIG. 3B on the bottom source and drains 302 and 304, respectively since a greater amount of the spacer material was deposited on the bottom source and drains 302 and 304. By way of example only, a high-density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

Gate stacks are next formed alongside the fins 202a/202b over the bottom spacers 308a and 308b. According to an exemplary embodiment, the gate stacks include an interfacial layer (IL), a high-κ gate dielectric over the IL layer, and a workfunction metal over the high-κ gate dielectric. Advantageously, as provided above, the gate workfunction will be set for the NFET and PFET devices using a unique top spacer design. Accordingly, the same gate stack materials can be employed in both the NFET and PFET devices. Thus, according to an exemplary embodiment, the formation of gate stacks is performed concurrently for the NFET and PFET devices.

Figure 4A:
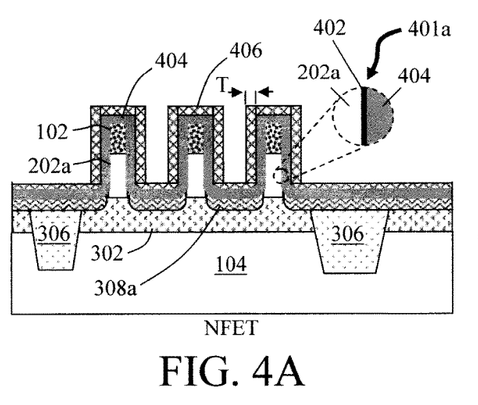
FIG. 4A is a cross-sectional diagram illustrating gate stacks having been formed alongside the NFET fins, the gate stacks including an interfacial layer, a high-κ gate dielectric and a workfunction metal according to an embodiment of the present invention.
Figure 4B:
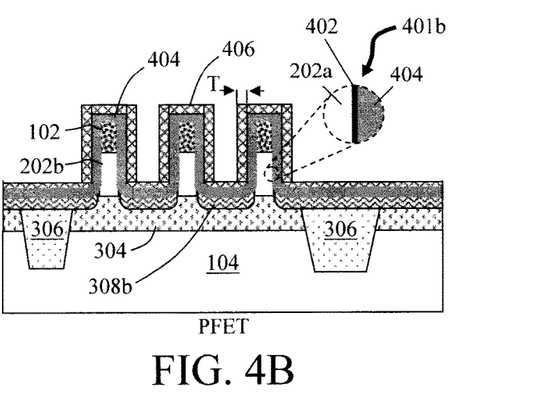
FIG. 4B is a cross-sectional diagram illustrating the gate stacks having been formed alongside the PFET fins according to an embodiment of the present invention.

Specifically, referring first to insets 401a and 401h in FIG. 4A and FIG. 4B (which provide magnified views of the gate stacks), an IL 402 is formed on the exposed fins 202a/202b. According to an exemplary embodiment, IL 402 (e.g., S102 which may include other chemical elements in it such as nitrogen, germanium, etc.) is formed by an oxidation process to a thickness of from about 0.3 nm to about 5 nm, and ranges therebetween, e.g., about 1 nm. A high-κ gate dielectric 404 is then deposited onto the IL 402 using a conformal deposition process such as chemical vapor deposition (CVD) or atomic layer deposition (ALD). Suitable high-κ gate dielectrics include, but are not limited to, Hf-based and/or Zr-based dielectric materials such as $HfO_2$ and/or zirconium oxide ($ZrO_2$). A workfunction metal 406 is then deposited on top of the high-κ gate dielectric 404 using a conformal deposition process such as CVD or ALD. Suitable workfunction metals include, but are not limited to, TiN and/or TaN. As provided above, the workfunction metal 406 needs to be deposited to a physical thickness T that is greater than a critical thickness $T_{CRIT}$ (i.e., $T > T_{CRIT}$). According to an exemplary embodiment, $T_{CRIT}$ is about 3.0 nm, and T is greater than about 3.0 nm, e.g., from about 3.5 nm to about 5.0 nm, and ranges therebetween. Use of the workfunction metal 406 at this thickness T imparts thermal stability to the design. See, for example, Ando et al., "Simple Gate Metal Anneal (SIGMA) Stack for FinFET Replacement Metal Gate Toward 14 nm and beyond," 2014 Symposium on VLSI Technology Digest of Technical Papers June 2014 (2 total pages) (hereinafter "Ando"), the contents of which are incorporated by reference as if fully set forth herein. As described in Ando, it is thought that positively charged oxygen vacancies are generated in the underlying gate dielectric during the subsequent workfunction metal anneal (see below). If the workfunction metal is below $T_{CRIT}$ then, over time and exposure to air, passivation of these positively charged oxygen vacancies occurs which shifts the effective workfunction (EWF). However, if the workfunction metal is thicker, i.e., greater than $T_{CRIT}$, then this passivation does not occur (because the thicker workfunction metal prevents air exposure) and the EWF remains stable.

Figure 5A:
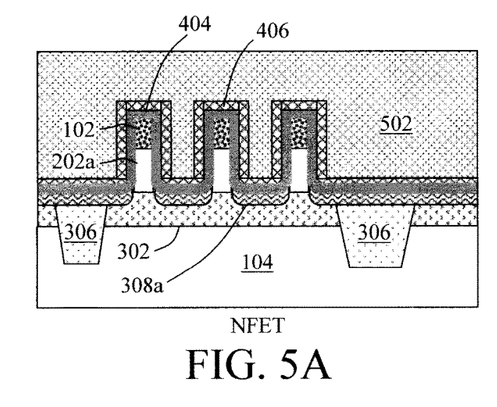
FIG. 5A is a cross-sectional diagram illustrating the (NFET) gate stacks having been buried in a dummy gate material according to an embodiment of the present invention.
Figure 5B:
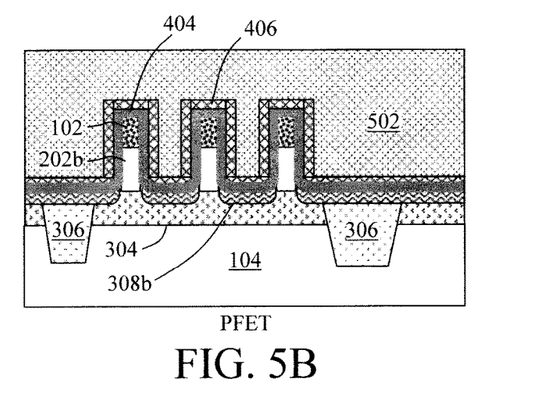
FIG. 5B is a cross-sectional diagram illustrating the (PFET) gate stacks having been buried in a dummy gate material according to an embodiment of the present invention.

The fins 202a/202b and gate stacks are then buried in a dummy gate material 502. See FIG. 5A and FIG. 5B, respectively. The dummy gate material 502 serves to protect the workfunction metal 406 from oxidation during the subsequent anneal process. Suitable dummy gate materials include, but are not limited to, amorphous silicon (a-Si) and/or poly-silicon (poly-Si). The dummy gate material 502 can be blanket deposited over the fins 202a/202b and gate stacks using a process such as CVD. The dummy gate material 502 can be deposited concurrently for the NFET and PFET devices.

Figure 6A:
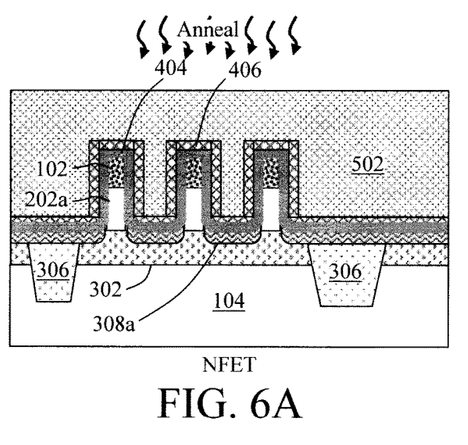
FIG. 6A is a cross-sectional diagram illustrating an anneal of the (NFET) gate stacks having been performed according to an embodiment of the present invention.
Figure 6B:
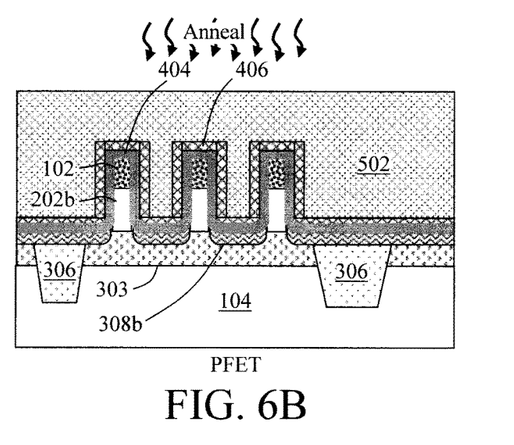
FIG. 6B is a cross-sectional diagram illustrating an anneal of the (PFET) gate stacks having been performed according to an embodiment of the present invention.

With the dummy gate material 502 in place, a reliability anneal of the gate stacks is then concurrently performed for the NFET and PFET devices. See FIGS. 6A and 6B, respectively. The anneal serves to set the effective workfunction of the gate stack to the range appropriate for NFET and to improve the reliability. According to an exemplary embodiment, the anneal is performed at a temperature of greater than about 900° C., e.g., from about 900° C. to about 1000° C. and ranges therebetween.

Following the anneal, the dummy gate material 502 is selectively removed (e.g., using a Si-selective etching process) and replaced with a gate fill metal 702 that is deposited over the fins 202a/202b and gate stacks, e.g., using a process such as CVD or plating. See FIG. 7A and FIG. 7B, respectively. The same gate fill metal 702 is used in both NFET and PFET devices. Thus, the dummy gate material 502 removal and gate fill metal 702 deposition can be performed concurrently for the NFET and PFET devices. Suitable gate fill metals include, but are not limited to, tungsten (W), copper (Cu) and/or aluminum (Al). The gate fill metal 702 is an additional component of the gate stacks (i.e., the gate stacks include high-κ gate dielectric 404/workfunction metal 406/gate fill metal 702).

Figure 7A:
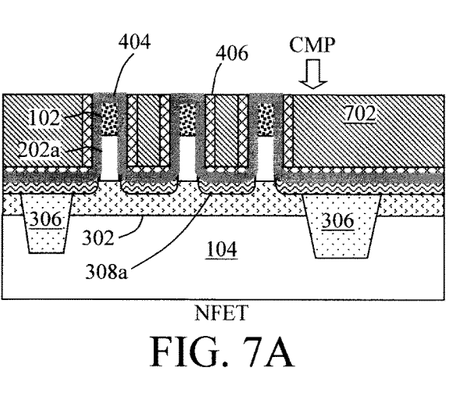
FIG. 7A is a cross-sectional diagram illustrating the dummy gate material having been selectively removed from over the NFET gate stacks and replaced with a gate fill metal according to an embodiment of the present invention.
Figure 7B:
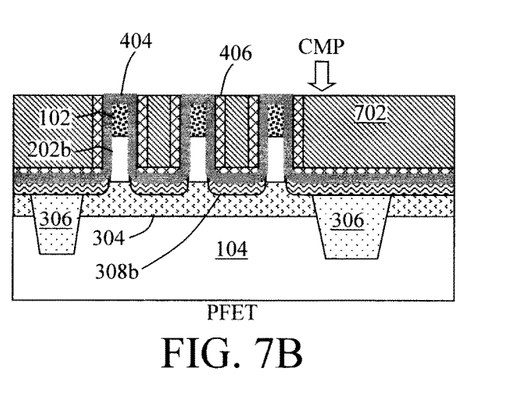
FIG. 7B is a cross-sectional diagram illustrating the dummy gate material having been selectively removed from over the PFET gate stacks and replaced with a gate fill metal according to an embodiment of the present invention.

As shown in FIG. 7A and FIG. 7B, any overfill of the gate fill metal 702 can be removed using chemical-mechanical polishing (CMP). Based on the polish selectivity between the gate metals, a CMP of the gate fill metal 702 can also remove the workfunction metal 406 from the tops of the gate stacks over the fins 202a/202b. This is inconsequential since the gate stacks will next be recessed for top differential spacer formation.

Figure 8A:
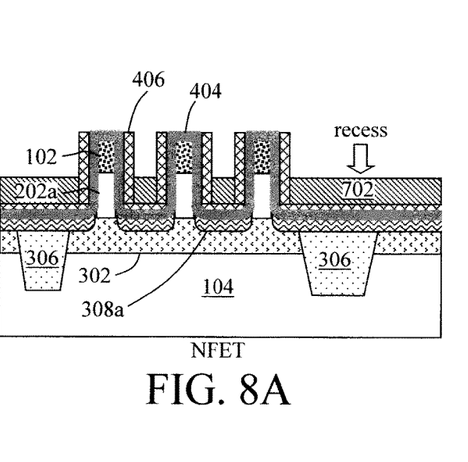
FIG. 8A is a cross-sectional diagram illustrating the gate fill metal having been recessed alongside the NFET gate stacks according to an embodiment of the present invention.
Figure 8B:
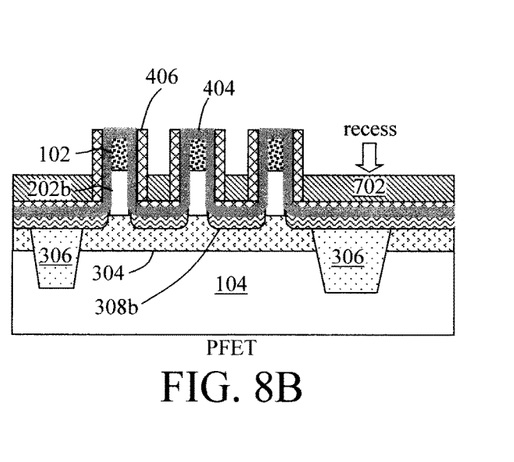
FIG. 8B is a cross-sectional diagram illustrating the gate fill metal having been recessed alongside the PFET gate stacks according to an embodiment of the present invention.

According to an exemplary embodiment, recessing of the gate stacks is accomplished concurrently in the NFET and PFET devices as follows. First, an etch is used to recess the gate fill metal 702 below the level of fin hardmasks 102 on fins 202a/202b. See FIG. 8A and FIG. 8B, respectively. This etch of the gate fill metal 702 is selective to the high-κ gate dielectric 404/workfunction metal 406. During the selective gate fill metal 702 etch, the fin hardmasks 102 remain protected by the high-κ gate dielectric 404/workfunction metal 406.

Figure 9A:
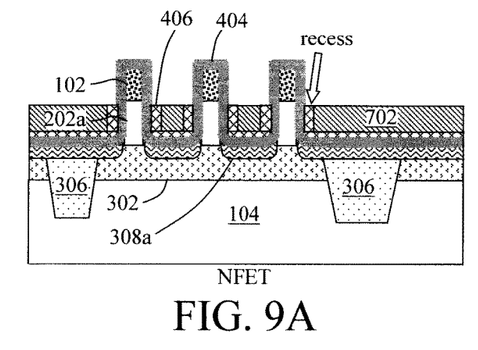
FIG. 9A is a cross-sectional diagram illustrating the workfunction metal having been recessed alongside the NFET gate stacks according to an embodiment of the present invention.
Figure 9B:
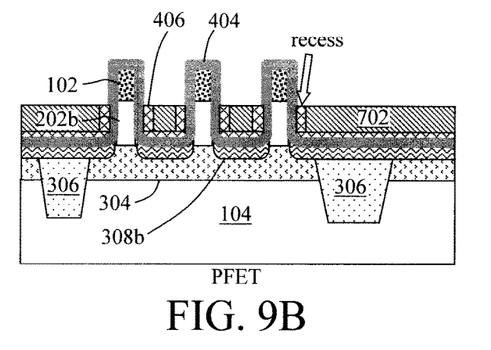
FIG. 9B is a cross-sectional diagram illustrating the workfunction metal having been recessed alongside the PFET gate stacks according to an embodiment of the present invention.

The depth of the gate fill metal 702 sets the overall depth for the gate stack recess. Namely, an etch is then used to recess the workfunction metal 406 to the depth set by the (recessed) gate fill metal 702 concurrently in the NFET and PFET devices. See FIG. 9A and FIG. 9B, respectively. This recess etch of the workfunction metal 406 is selective to the high-κ gate dielectric 404. According to an exemplary embodiment, a directional etching process such as RIE is employed for the workfunction metal 406 recess. As provided above, the workfunction metal 406 can include a metal nitride (e.g., TiN and/or TaN), while the high-κ gate dielectric 404 can include an oxide material (e.g., HfO$_2$ and/or ZrO$_2$). Thus, a nitride-selective RIE would provide etch selectivity vis-à-vis the high-κ gate dielectric 404.

Finally, an etch is then used to recess the IL/high-κ gate dielectric 404 concurrently in the NFET and PFET devices. See FIG. 10A and FIG. 10B, respectively. According to an exemplary embodiment, a non-directional (i.e., isotropic) etching process such as a wet etching process is employed for the IL/high-κ gate dielectric 404 recess. A wet etch will remove the exposed IL and high-κ gate dielectric 404 down to the level of the (recessed) workfunction metal 406/gate fill metal 702.

Figure 10A:
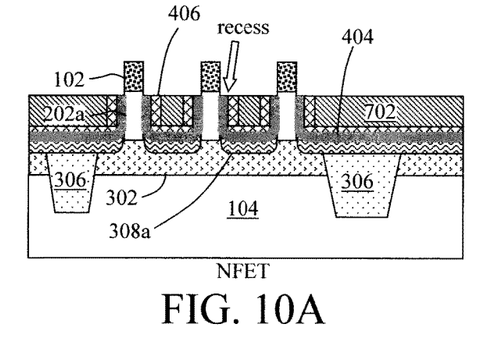
FIG. 10A is a cross-sectional diagram illustrating the high-κ gate dielectric having been recessed alongside the NFET gate stacks according to an embodiment of the present invention.
Figure 10B:
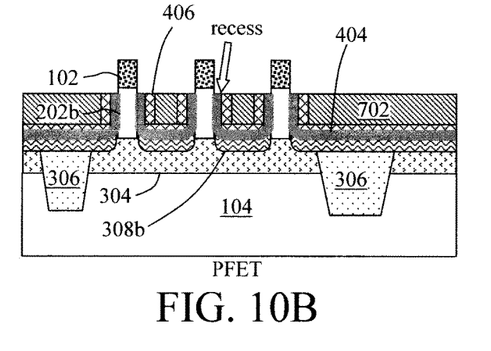
FIG. 10B is a cross-sectional diagram illustrating the high-κ gate dielectric having been recessed alongside the PFET gate stacks according to an embodiment of the present invention.

It is notable that, based on the above-described process, the ends of the (recessed) high-κ gate dielectric 404 are now exposed at the tops of the fins 202a/202b. As will become apparent from the description that follows, this aspect is important since an oxygen source will be provided (by way of differential top spacers) to selectively tune the workfunction of the PFET devices by introducing oxygen to fill the vacancies in the high-κ gate dielectric 404 (see above).

By 'differential' it is meant that the top spacers formed on the NFET devices are different from the top spacers formed on the PFET devices, and vice versa. Specifically, nitride/oxide/nitride spacers will be formed on the NFET devices, whereas oxide/nitride spacers will be formed on the PFET devices. This differential top spacer configuration enables the oxide component of the spacers to serve as an oxygen source for the PFET devices, while the first nitride component (present only in the NFET devices) shields the NFET devices from this oxygen source. For a general discussion of an oxygen supply from an oxide spacer for modulating PFET workfunction see, for example, Kim et al., "Novel Single Metal Gate CMOS Integration with Effective Workfunction Modulation by a Differential Spacer: Manipulation of Oxygen Vacancy," 2009 International Conference on Solid State Devices and Materials, (October 2009) (2 total pages) (hereinafter "Kim"), the contents of which are incorporated by reference as if fully set forth herein.

Figure 11A:
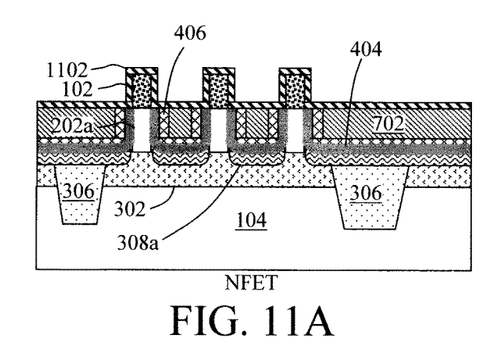
FIG. 11A is a cross-sectional diagram illustrating a first nitride spacer layer having been deposited over the NFET gate stacks according to an embodiment of the present invention.
Figure 11B:
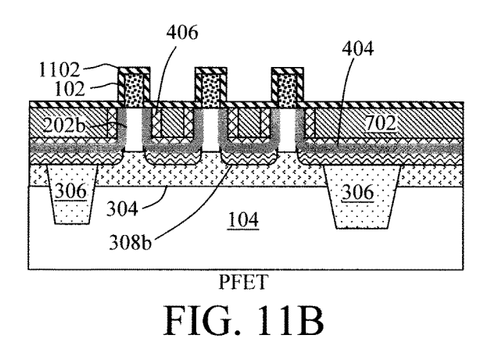
FIG. 11B is a cross-sectional diagram illustrating the first nitride spacer layer having been deposited over the PFET gate stacks according to an embodiment of the present invention.

To form the differential top spacers on the NFET and PFET devices, a (first) nitride spacer layer 1102 is deposited concurrently over the gate stacks and fins hardmasks 102 in both the NFET and PFET devices. See FIG. 11A and FIG. 11B, respectively. Suitable materials for the first nitride spacer layer 1102 include, but are not limited to, SiN and/or SiBN. Preferably, the first nitride spacer layer 1102 is deposited using a process such as plasma enhanced chemical vapor deposition (PECVD) or ALD.

Figure 12A:
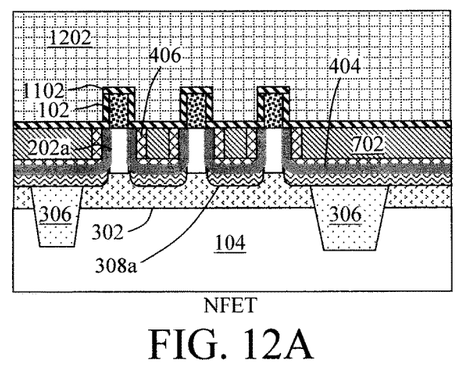
FIG. 12A is a cross-sectional diagram illustrating a block mask having been formed covering the first nitride spacer layer over the NFET gate stacks according to an embodiment of the present invention.
Figure 12B:
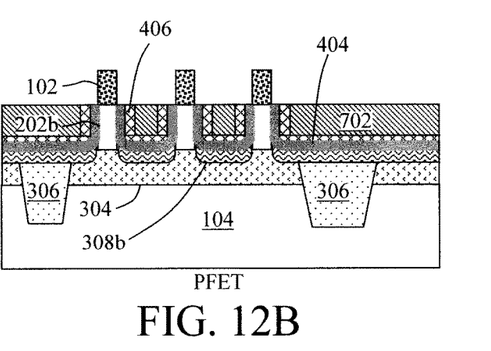
FIG. 12B is a cross-sectional diagram illustrating the first nitride spacer layer having been removed from the PFET gate stacks according to an embodiment of the present invention.

This first nitride spacer layer 1102 is to remain in the NFET devices (i.e., to shield the NFET gate stacks from the oxide spacer component that is formed next), but be removed from the PFET devices. To do so, the first nitride spacer layer 1102 is selectively masked over the NFET devices (see FIG. 12A) and an etch (e.g., a nitride-selective etch) is then used to remove the first nitride spacer layer 1102 from the PFET devices (see FIG. 12B). According to an exemplary embodiment, a standard block mask 1202 (see FIG. 12A) is used to cover the first nitride spacer layer 1102 over the NFET devices. Following the etch, the block mask 1202 is removed.

Concurrent processing of the NFET and PFET devices resumes to complete formation of the differential top spacers. Namely, an oxide spacer layer 1302 is next deposited concurrently over the first nitride spacer layer 1102 in the NFET devices (see FIG. 13A) and over the gate stacks and fins hardmasks 102 in the PFET devices (see FIG. 13B). Suitable materials for the oxide spacer layer 1302 include, but are not limited to, $SiO_2$ and/or SiOC. Preferably, the oxide spacer layer 1302 is deposited at a (low) temperature of less than about 400° C., e.g., from about 200° C. to about 400° C. and ranges therebetween, using a process such as PECVD or ALD. As described in Kim, low temperature deposited oxide spacers have a high O—H content which, when released, passivate the oxygen vacancies in the gate dielectric.

Figure 13A:
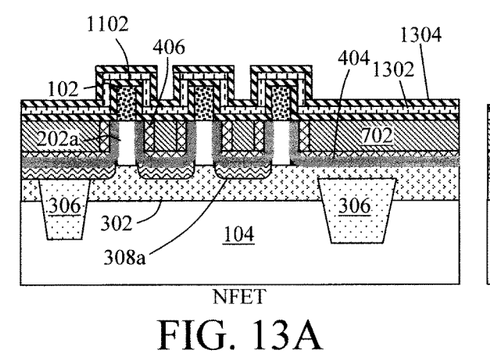
FIG. 13A is a cross-sectional diagram illustrating an oxide spacer layer having been deposited onto the first nitride spacer layer over the NFET gate stacks, and a second nitride spacer layer having been deposited onto the oxide spacer layer according to an embodiment of the present invention.
Figure 13B:
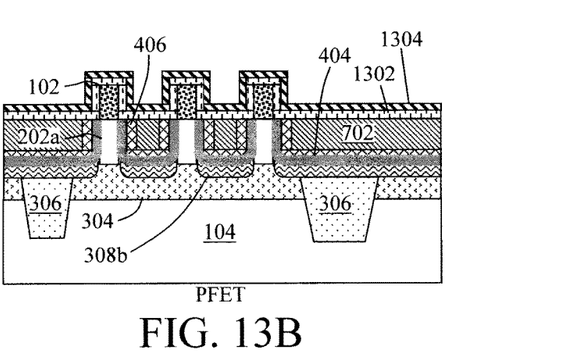
FIG. 13B is a cross-sectional diagram illustrating the oxide spacer layer having been deposited onto the PFET gate stacks, and the second nitride spacer layer having been deposited onto the oxide spacer layer according to an embodiment of the present invention.

A (second) nitride spacer layer 1304 is then deposited concurrently over the oxide spacer layer 1302 in the NFET and PFET devices. Suitable materials for the second nitride spacer layer 1304 include, but are not limited to, SiN and/or SiBN. Preferably, the second nitride spacer layer 1304 is deposited using a process such as PECVD or ALD.

An etch is then performed, concurrently in the NFET and PFET devices, to pattern the first nitride spacer layer 1102 (only in the NFET devices)/oxide spacer layer 1302/second nitride spacer layer 1304 into individual spacers at the tops of the fins 202a/202b. See FIG. 14A and FIG. 14B, respectively. A directional etching process such as RIE may be employed for the differential spacer etch. According to an exemplary embodiment, a series of nitride-selective and oxide-selective RIE steps are performed for the differential spacer etch.

Figure 14A:
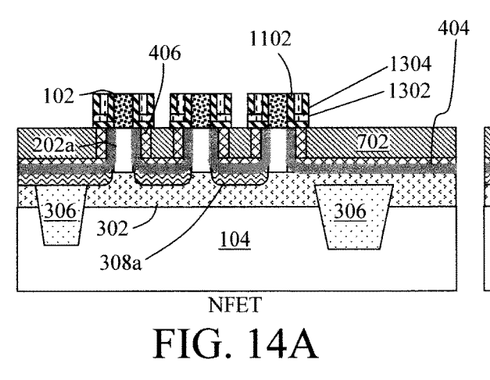
FIG. 14A is a cross-sectional diagram illustrating the first nitride spacer layer, the oxide spacer layer and the second nitride spacer layer having been patterned into individual spacers at the tops of the NFET fins according to an embodiment of the present invention.
Figure 14B:
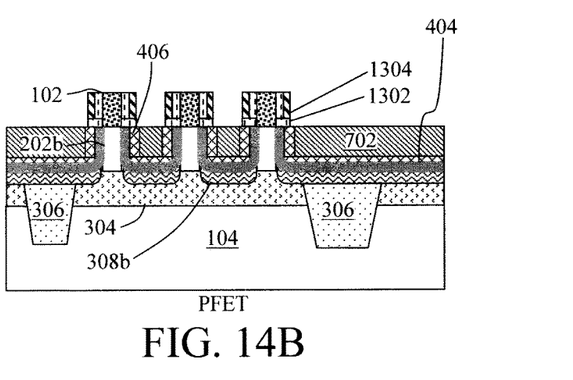
FIG. 14B is a cross-sectional diagram illustrating the oxide spacer layer and the second nitride spacer layer having been patterned into individual spacers at the tops of the PFET fins according to an embodiment of the present invention.

As shown in FIG. 14A, the differential spacers at the tops of the NFET fins 202a have a nitride/oxide/nitride configuration patterned from the first nitride spacer layer 1102/oxide spacer layer 1302/second nitride spacer layer 1304, respectively. By comparison, as shown in FIG. 14B, the differential spacers at the tops of the PFET fins 202a have an oxide/nitride configuration patterned from the oxide spacer layer 1302/second nitride spacer layer 1304, respectively. With regard to the NFET devices, the first nitride spacer layer 1102 shields the NFET gate stacks from the oxide spacer layer 1302. See FIG. 14A. However, in the PFET devices the oxide spacer layer 1302 is in direct contact with the high-κ gate dielectric 404. See FIG. 14B. The oxide spacer layer 1302 serves as a source for oxygen to fill the vacancies in the high-κ gate dielectric 404, thus altering the workfunction of the PFET devices (relative to the NFET devices). See Kim. Further, as described in Ando, simply exposing the high-κ gate dielectric 404 to the oxygen source will overtime (e.g., from 0 to 1600 hours) alter the effective workfunction (EWF) of the devices (in this case the PFET devices). See, for example, Ando FIG. 3.

Figure 15A:
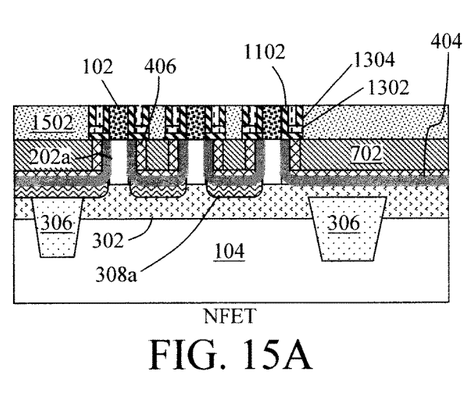
FIG. 15A is a cross-sectional diagram illustrating the NFET fins having been buried in an interlayer dielectric (ILD) that is then polished down to the fin hardmasks according to an embodiment of the present invention.
Figure 15B:
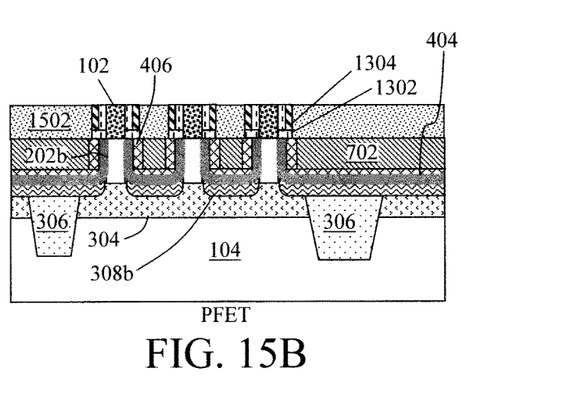
FIG. 15B is a cross-sectional diagram illustrating the PFET fins having been buried in the ILD that is then polished down to the fin hardmasks according to an embodiment of the present invention.

Top source and drains are then formed to the NFET and PFET devices. To do so, the NFET and PFET fins 202a/202b are first buried in an interlayer dielectric (ILD) 1502. See FIG. 15A and FIG. 15B, respectively. Suitable ILD materials include, but are not limited to, oxide dielectric materials such as $SiO_2$. Excess ILD 1502 is removed, exposing the tops of the fin hardmasks 102. A process such as CMP can be employed in this step to polish the ILD 1502 down to the fin hardmasks 102. The deposition and polishing of the ILD 1502 can be performed concurrently in the NFET and PFET devices.

Figure 16A:
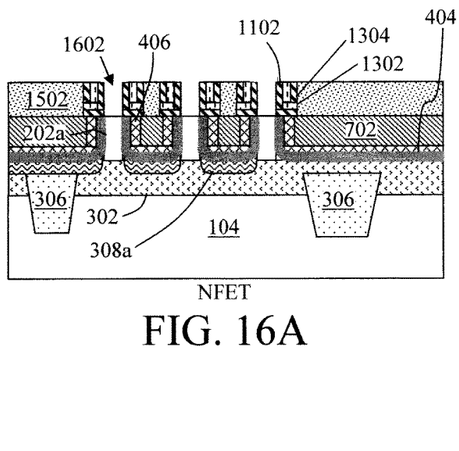
FIG. 16A is a cross-sectional diagram illustrating the fin hardmasks having been removed forming trenches in the ILD between the individual spacers over the NFET fins according to an embodiment of the present invention.
Figure 16B:
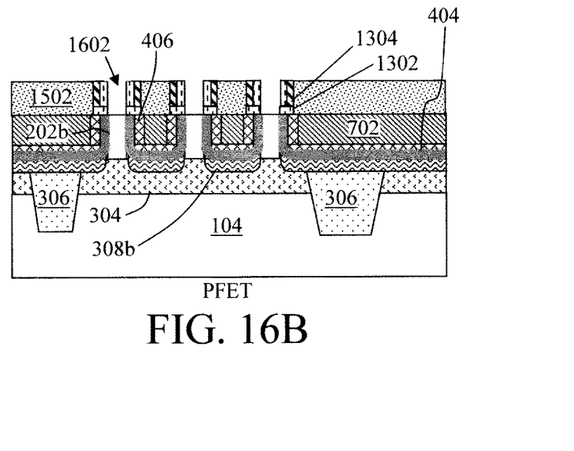
FIG. 16B is a cross-sectional diagram illustrating the fin hardmasks having been removed forming trenches in the ILD between the individual spacers over the PFET fins according to an embodiment of the present invention.

Once exposed, the fin hardmasks 102 are then removed (concurrently) from the NFET and PFET devices. See FIG. 16A and FIG. 16B, respectively. The fin hardmasks 102 can be removed using a nitride-selective etching process such as a nitride-selective RIE. As shown in FIG. 16A and FIG. 16B, removal of the fin hardmasks 102 forms trenches 1602 in between the top spacers over the fins 202a/202b.

Figure 17A:
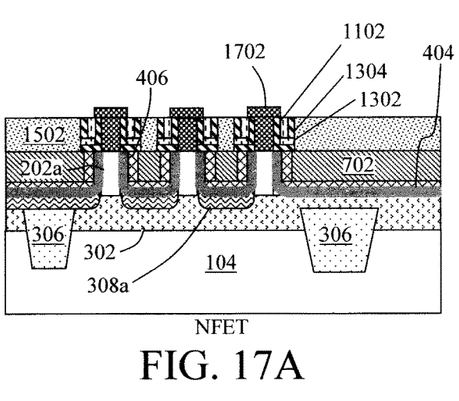
FIG. 17A is a cross-sectional diagram illustrating top source and drains having been formed in the trenches at the tops of the NFET fins according to an embodiment of the present invention.
Figure 17B:
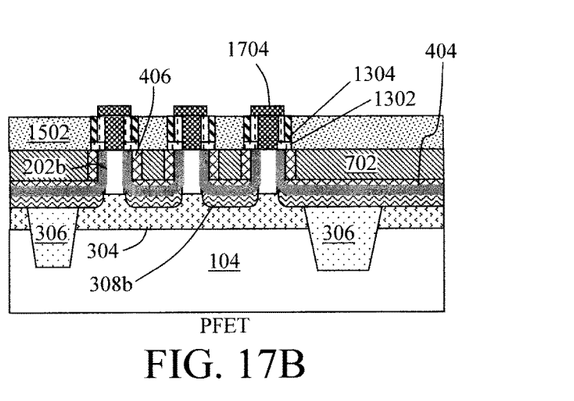
FIG. 17B is a cross-sectional diagram illustrating top source and drains having been formed in the trenches at the tops of the PFET fins according to an embodiment of the present invention.

Top source and drains 1702 and 1704 are then formed in the trenches 1602 at the tops of the fins 202a/202b. See FIG. 17A and FIG. 17B, respectively. According to an exemplary embodiment, the top source and drains 1702 and 1704 are formed by growing an in-situ (during epitaxial growth) or ex-situ (via ion implantation) doped epitaxial material at the tops of the fins 202a and 202b. As provided above, suitable n-type dopants include, but are not limited to, phosphorous (P) and/or arsenic (As), and suitable p-type dopants include, but are not limited to, boron (B). By way of example only, Si:P may be grown for the NFET devices and SiGe:B may be grown for the PFET devices.

Figure 18:
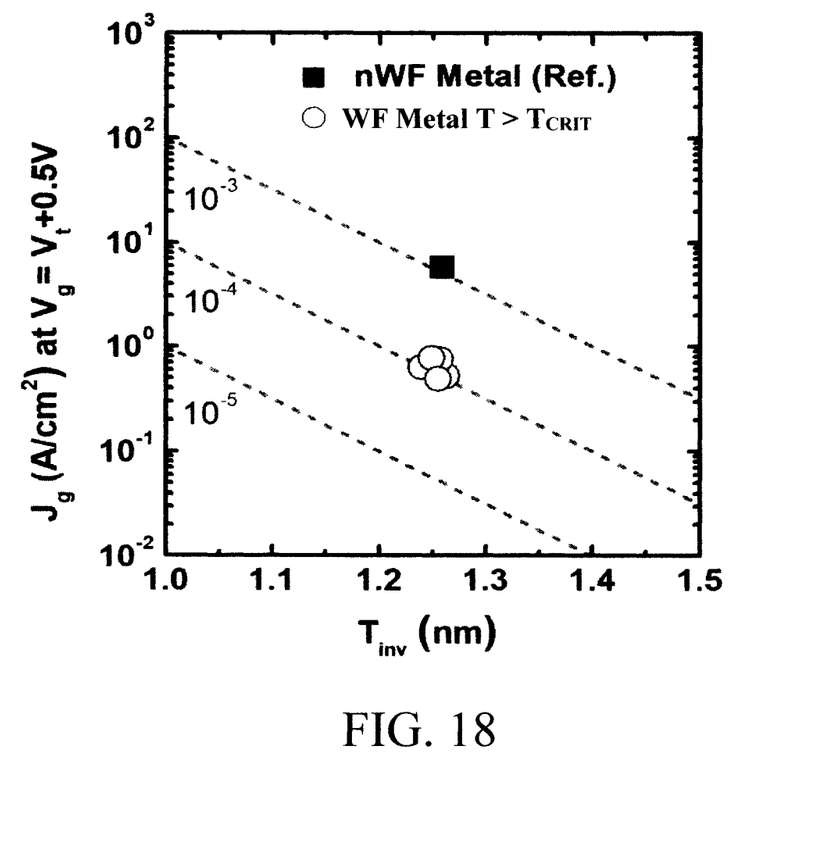
FIG. 18 is a diagram illustrating performance of samples prepared according to the present techniques after being subjected to a high temperature anneal according to an embodiment of the present invention.

FIG. 18 is a diagram illustrating gate leakage $J_g$ as a function of inversion thickness $T_{inv}$ for a reference sample (Ref.) and samples prepared according to the present techniques having a workfunction metal with $T > T_{CRIT}$ over a high-κ gate dielectric. As shown in FIG. 18, a $T_{inv}$ of 1.25 nm and a $J_g$ 1 A/cm$^2$ (Toxgl 1.55 nm) was maintained after a rapid thermal anneal (RTA) at 970° C., thus indicating no degradation of leakage in the present samples.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical transport field effect transistor (VTFET) device, comprising the steps of:
    patterning fins in a wafer, the fins comprising n-channel FET (NFET) fins and p-channel FET (PFET) fins;
    forming bottom source and drains at a base of the NFET fins and the PFET fins;
    forming bottom spacers on the bottom source and drains;
    forming gate stacks alongside the NFET fins and the PFET fins, wherein the gate stacks formed alongside the NFET fins and the PFET fins comprise a same workfunction metal on top of a gate dielectric;
    annealing the gate stacks which generates oxygen vacancies in the gate dielectric;
    depositing a gate fill metal over the NFET fins, the PFET fins and the gate stacks;
    forming top spacers over the gate stacks at tops of the NFET fins and the PFET fins, wherein the top spacers comprise an oxide spacer layer in contact with only the gate stacks alongside the PFET fins, wherein the oxide spacer layer supplies oxygen filling the oxygen vacancies in the gate dielectric only in the gate stacks alongside the PFET fins; and
    forming top source and drains above the gate stacks at the tops of the NFET fins and the PFET fins.

2. The method of claim 1, wherein the workfunction metal is selected from the group consisting of: titanium nitride (TiN), tantalum nitride (TaN), and combinations thereof.

3. The method of claim 1, wherein the workfunction metal has a thickness T of greater than about 3.0 nm.

4. The method of claim 3, wherein T is from about 3.5 nm to about 5.0 nm and ranges therebetween.

5. The method of claim 1, wherein the gate dielectric comprises a high-κ gate dielectric selected from the group consisting of: hafnium oxide ($HfO_2$), zirconium oxide ($ZrO_2$), and combinations thereof.

6. The method of claim 1, wherein the annealing is performed at a temperature of from about 900° C. to about 1000° C. and ranges therebetween.

7. The method of claim 1, further comprising the steps of:
burying the NFET fins, the PFET fins and the gate stacks in a dummy gate material; and
removing the dummy gate material after the annealing has been performed.

8. The method of claim 7, wherein the dummy gate material is selected from the group consisting of: amorphous silicon, poly silicon, and combinations thereof.

9. The method of claim 1, wherein the gate fill metal is selected from the group consisting of: tungsten (W), copper (Cu), aluminum (Al), and combinations thereof.

10. The method of claim 1, wherein the top spacers at the tops of the NFET fins comprise:
a first nitride spacer layer;
the oxide spacer layer disposed on the first nitride spacer layer; and
a second nitride spacer layer disposed on the oxide spacer layer.

11. The method of claim 10, wherein the top spacers at the tops of the PFET fins comprise:
the oxide spacer layer; and
the second nitride spacer layer disposed on the oxide spacer layer.

12. The method of claim 11, wherein the step of forming the top spacers comprises the steps of:
depositing the first nitride spacer layer over the gate stacks alongside the NFET fins and the PFET fins;
selectively removing the first nitride spacer layer from the gate stacks alongside the PFET fins;
depositing the oxide spacer layer onto i) the first nitride spacer layer over the gate stacks alongside the NFET fins and ii) the gate stacks alongside the PFET fins; and
depositing the second nitride spacer layer onto the oxide spacer layer.

13. The method of claim 12, wherein the oxide spacer layer is deposited at a temperature of from about 200° C. to about 400° C. and ranges therebetween.

14. The method of claim 12, further comprising the step of:
patterning the first nitride spacer layer, the oxide spacer layer and the second nitride spacer layer to form individual spacers at the tops of the NFET fins and the PFET fins.

* * * * *